US012650538B2

(12) United States Patent
Schunemann et al.

(10) Patent No.: US 12,650,538 B2
(45) Date of Patent: Jun. 9, 2026

(54) METHOD OF PRODUCING LARGE GaAs AND GaP INFRARED WINDOWS

(71) Applicant: BAE SYSTEMS Information and Electronic Systems Integration Inc., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 672 days.

(21) Appl. No.: 18/073,177

(22) Filed: Dec. 1, 2022

(65) Prior Publication Data

US 2024/0184015 A1 Jun. 6, 2024

(51) Int. Cl.
*G02B 1/02* (2006.01)
*C30B 25/18* (2006.01)
(Continued)

(52) U.S. Cl.
CPC ............... *G02B 1/02* (2013.01); *C30B 25/18* (2013.01); *C30B 29/42* (2013.01); *C30B 29/44* (2013.01);
(Continued)

(58) Field of Classification Search
CPC ... G02B 1/02; G02B 1/00; G02B 1/10; G02B 1/11; G02B 1/113; G02B 2207/121;
(Continued)

(56) References Cited

U.S. PATENT DOCUMENTS 3,944,393 A 3/1976 Schierding
4,776,971 A * 10/1988 Mattera ................... C30B 29/42
117/3
(Continued)

OTHER PUBLICATIONS

Jeremy B. Reeves et. al., Method of Optimizing the EMI Shielding and Infrared Transparency of GaAs IR Windows, patent application, filed Dec. 1, 2022, U.S. Appl. No. 18/072,931.
(Continued)

*Primary Examiner* — Arnel C Lavarias
(74) *Attorney, Agent, or Firm* — Maine Cernota & Curran; Gary McFaline

(57) ABSTRACT

IR window slabs of GaP greater than 4 inches diameter, and of GaAs greater than 8 inches diameter, are grown on a substrate using Hydride Vapor Phase Epitaxy (HVPE), preferably low pressure HVPE (LP-HVPE). Growth rates can be hundreds of microns per hour, comparable to vertical melt growth. GaAs IR windows produced by the disclosed method exhibit lower absorption than crystals grown from vertical melt near 1 micron, due to reduced impurities and reduced growth temperatures that limit the solubility of excess arsenic, and thereby reduce the "EL2" defects that cause high absorption near one micron in conventional GaAs boules. Silicon wafers can be used as HVPE substrates. For GaAs, layers of GaAsP that vary from 0% to 100% As can be applied to the substrate. EMI shielding can be applied by adding a dopant during the final stage of growth to provide a conductive GaAs or GaP layer.

8 Claims, 5 Drawing Sheets

312

100

(51) Int. Cl.

| | |
|---|---|
| *C30B 29/42* | (2006.01) |
| *C30B 29/44* | (2006.01) |
| *C30B 31/06* | (2006.01) |
| *H05K 9/00* | (2006.01) |

(52) U.S. Cl.
CPC ........... *C30B 31/06* (2013.01); *H05K 9/0081* (2013.01); *H05K 9/0094* (2013.01)

(58) Field of Classification Search
CPC ......... C30B 25/18; C30B 29/42; C30B 29/44; C30B 31/06; C30B 25/00; C30B 25/02; C30B 25/025; C30B 25/08; C30B 25/12; C30B 25/14; C30B 25/16; C30B 25/183; C30B 31/08; H05K 9/0081; H05K 9/0094; H05K 9/0084
USPC .................................. 359/350; 252/582, 587
See application file for complete search history.

(56) References Cited

U.S. PATENT DOCUMENTS

| | | | | |
|---|---|---|---|---|
| 4,778,731 | A | 10/1988 | Kraatz | |
| 4,939,043 | A | 7/1990 | Biricik | |
| 5,007,979 | A | 4/1991 | Mizuniwa | |
| 5,173,443 | A | 12/1992 | Biricik | |
| 5,824,418 | A | 10/1998 | Tully | |
| 6,287,478 | B1 * | 9/2001 | Klocek | C30B 29/64 |
| | | | | 148/DIG. 60 |
| 10,156,023 | B2 | 12/2018 | Schunemann | |
| 12,084,791 | B2 * | 9/2024 | Schunemann | C30B 29/42 |
| 12,203,192 | B2 * | 1/2025 | Reeves | H05K 9/0005 |
| 12,302,542 | B2 * | 5/2025 | Schunemann | C23C 16/306 |

| | | | | |
|---|---|---|---|---|
| 2003/0172870 | A1 | 9/2003 | Liu | |
| 2010/0219509 | A1 | 9/2010 | He | |
| 2011/0256693 | A1 | 10/2011 | D'Evelyn | |
| 2012/0031324 | A1 | 2/2012 | Hiromura | |
| 2012/0097092 | A1 | 4/2012 | Zhu | |
| 2012/0255484 | A1 | 10/2012 | Zhu | |
| 2014/0162441 | A1 | 6/2014 | Preble | |
| 2017/0362739 | A1 | 12/2017 | Kajimoto | |
| 2024/0183065 | A1 * | 6/2024 | Schunemann | C30B 29/42 |

OTHER PUBLICATIONS

Peter G. Schunemann et. al., Method of Producing Large EMI Shielded GaAs Infrared Windows, patent application, filed Dec. 1, 2022, U.S. Appl. No. 18/073,179.

Peter G. Schunemann et. al., Method of Producing Large EMI Shielded GaAs and GaP Infrared Windows, patent application, filed Dec. 1, 2022, U.S. Appl. No. 18/073,183.

Peter G. Schunemann et. al., Method of Producing Large GaAs and GaP Infrared Windows, patent application, filed Dec. 1, 2022, U.S. Appl. No. 18/073,228.

Sotoodeh, M., A. H. Khalid, and A. A. Rezazadeh. "Empirical low-field mobility model for III-V compounds applicable in device simulation codes." Journal of applied physics 87.6 dated Mar. 15, 2000): 2890-2900.

Stromberg, A., Bhargava, P., Xu, Z., Lourdudoss, S. and Sun, Y. (2021), Direct Heteroepitaxy and Selective Area Growth of GaP and GaAs on Si by Hydride Vapor Phase Epitaxy. Phys. Status Solidi A, dated Oct. 17, 2020 218.3.

Office Action for U.S. Appl. No. 18/073,179 mail date Sep. 10, 2024, 16 pages.

Notice of Allowance for U.S. Appl. No. 18/073,228 mail date 240930, 15 pages (Sep. 30, 2024).

* cited by examiner

312

100

METHOD OF PRODUCING LARGE GaAs AND GaP INFRARED WINDOWS

RELATED APPLICATIONS

This application is related to co-pending US application Ser. No. 18/072,931 entitled METHOD OF OPTIMIZING THE EMI SHIELDING AND INFRARED TRANSPARENCY OF GaAs IR WINDOWS with first inventor Jeremy B. Reeves, filed on Dec. 1, 2022, U.S. application Ser. No. 18/073,179 entitled METHOD OF PRODUCING LARGE EMI SHIELDED GaAs INFRARED WINDOWS with first inventor Peter G. Schunemann, filed on Dec. 1, 2022, U.S. application Ser. No. 18/073,183 entitled METHOD OF PRODUCING LARGE EMI SHIELDED GaAs AND GaP INFRARED WINDOWS with first inventor Peter G. Schunemann, filed on Dec. 1, 2022, and U.S. application Ser. No. 18/073,228 entitled METHOD OF PRODUCING LARGE GaAs AND GaP INFRARED WINDOWS with first inventor Peter G. Schunemann, filed on Dec. 1, 2022, all of which are also by the present Applicant, all of which are herein incorporated by reference in their entirety for all purposes.

FIELD

The disclosure relates to optical windows, and more particularly, to GaAs optical windows that are transparent to infrared light and are more than eight inches in diameter, and to GaP optical windows that are transparent to infrared light and are more than four inches in diameter.

BACKGROUND

A growing number of optical systems incorporate infrared (IR) sensors and/or lasers that operate over a wide range of wavelengths between one and twelve microns. Accordingly, the platforms on which these devices are mounted require optical windows that are transparent over this broad spectral range. A growing number of these applications require windows having a largest diameter of more than 8 inches, and in some cases more than 12 inches, which in turn requires that the window material must be relatively hard, so that the window will be structurally competent without being unduly thick.

Furthermore, as electronics and sensor systems become more highly and densely integrated, the need has increased for electromagnetic shielding (EMI) of components. For systems that require optical windows, it has therefore become increasingly necessary to provide EMI shielded windows, i.e. windows that have very low absorption at wavelengths of interest, while also shielding the window aperture against electromagnetic penetration.

The material that is most commonly used to manufacture such IR windows is hot-isostatic-pressed (HIP) polycrystalline Zinc Sulfide (ZnS), due to the broad spectral transparency of ZnS, because the HIP process is relatively quick, and because the window size when using this polycrystalline material is limited only by the size of the high-pressure containment vessel in which the HIP is applied. However, the mechanical properties of HIP ZnS are only adequate at best, which can sometimes limit application of the material to large IR windows, such as IR windows greater than 12 inches in diameter.

When EMI shielding is required, HIP ZnS windows generally rely on a metallic grid coating deposited onto a window surface. However, the metal lines in the grid coating are opaque to IR radiation, obscuring portions of the window, and can significantly reduce the optical transmission of the window, especially at large angles of incidence. Additionally, the grid pattern can lead to diffraction of IR waves passing through the material, which can have substantial negative impacts on system performance.

In many cases, to provide EMI shielding, it would be preferable to deposit a thin conducting layer of a doped semiconductor onto a surface of an IR window, as an alternative to a metallic grid. Unfortunately, it is nearly impossible to dope ZnS to produce a conductive EMI layer, due to its tendency to form compensating defects that neutralize dopants to maintain their insulating properties. This problem can be circumvented by preparing a separate, thin wafer of a doped semiconductor such as GaAs, and then attaching the wafer to the surface of an HIP ZnS window by optical bonding. However, this approach can be time consuming, difficult, and expensive.

As is discussed in more detail in co-pending U.S. application Ser. No. 18/072,931, filed on Dec. 1, 2022, which is also by the present Applicant and is incorporated herein by reference, IR windows made from gallium arsenide (GaAs) or gallium phosphide (GaP) are a potential alternative to windows made from HIP ZnS.

GaAs is highly transparent from 1.7 to 12 microns, exhibits about 3.5× higher hardness compared to HIP ZnS, and can be easily and precisely doped to control the electrical properties of thin epitaxially applied conducting layers.

Gallium phosphide, GaP, is highly transparent between 0.7 and 8.5 microns, and does not absorb strongly until nearly 11 microns. It has an even higher mechanical strength than GaAs, and substantially higher visible and near-IR transparency than GaAs, at the expense of reduced transparency at longer wavelengths. Like GaAs, GaP can also be easily and precisely doped to control the electrical properties of thin, epitaxially applied conducting layers.

Relatively small, thin wafers of GaAs and GaP have been widely used in the integrated circuit (IC) and photovoltaic (i.e. solar cell) industries. GaAs and GaP substrate wafers are cut from single crystals grown by melt techniques, primarily Czochralski (Cz) or Vertical Gradient Freeze (VGF) growth. IC's, solar cells, and other multi-layer device structures are typically then grown on these substrates by epitaxial methods such as Molecular Beam Epitaxy (MBE) or Metal Organic Vapor Phase Epitaxy (MOVPE) with precisely controlled layer thicknesses. The total device structures are limited to thicknesses of several microns, and scaling to thicknesses beyond this is precluded by the very slow growth rates achievable by these epitaxial techniques.

The Cz and VGF techniques used to produce GaAs and GaP substrates for most IC and photovoltaic applications could also be used to produce IR windows by slicing much thicker slabs (several millimeters) from the single crystal boules grown from melt. However, boules of GaAs that are grown from melt are generally limited to eight inches in diameter or less, while boules of GaP are generally limited to only 3 inches in diameter, and even these are not widely available. Furthermore, scaling the existing GaAs melt-growth techniques to larger diameters would be extremely challenging, for both GaAs and GaP, due to the difficulty of extracting more and more heat while controlling the interface shape and crystal quality during growth from ever increasing melt sizes. Managing the high equilibrium vapor pressure during growth, particularly for GaP, becomes problematic at larger boule diameters.

This inability to produce larger diameter boules has prevented the use of GaAs and GaP as slab materials for large EMI-shielded IR windows, e.g. for GaAs windows having a largest dimension that is greater than 8 inches, and up to 12 inches and more, and for GaP EMI-shielded IR windows having a largest dimention that is greater than 4 inches. Furthermore, GaAs window slabs that are sliced from boules have significant IR absorption bands, especially near 1 micron, due to so-called "EL2" defects that arise from excess arsenic being incorporated into the crystal structure. This has further limited the use of GaAs IR windows when transparency is desired near 1 micron, even for windows less than eight inches in diameter.

What is needed, therefore, is a method of making GaAs slabs having largest dimensions greater than 4 inches and GaP slabs having largest dimensions greater than 8 inches, and preferably up to 12 inches or more, where the slabs are sufficiently thick to be structurally competent when used as IR windows, and preferably, for GaAs slabs, having good transparency at wavelengths near one micron.

SUMMARY

The present disclosure is a method of making GaAs slabs having largest dimensions greater than 8 inches, and preferably up to 12 inches or more, and GaP slabs having largest dimensions greater than 4 inches, where the slabs are sufficiently thick to be structurally competent when used as IR windows, and wherein the GaAs slabs that are produced using the disclosed method have good transparency at wavelengths near one micron.

It will be understood that the present disclosure is not limited to round GaAs and GaP slabs, and that the term "diameter" as used herein should be interpreted to mean "largest dimension" unless otherwise required by context.

More specifically, the present disclosure teaches using Hydride Vapor Phase Epitaxy (HVPE) as a method of making and GaP window slabs having largest dimensions of greater than 4 inches, and GaAs IR window slabs having largest dimensions of greater than 8 inches, and in embodiments greater than 12 inches or more. In embodiments, low pressure HVPE (LP-HVPE) is used to make the slabs.

As with other epitaxial methods, HVPE has been used for growing thin layers of GaAs and GaP on melt-grown substrates for use in integrated circuits and other electronic devices, as well as for electro-optic applications such as solar cells. In conceiving the disclosed method, the inventors have realized that, unlike most epitaxial growth methods, HVPE, and especially LP-HVPE, can provide GaAs or GaP growth rates of hundreds of microns per hour, which is comparable to vertical melt growth rates, and thereby sufficient, in a practical sense, for producing GaAs and GaP slabs that are thick enough to be structurally competent as IR windows.

Furthermore, the thermodynamics and kinetics of the HVPE growth process (and the resulting crystal quality) are independent of diameter and layer thickness. Consequently large-diameter substrates, and a reactor large enough to accommodate them, are fundamentally all that is required for growing GaAs and GaP window slabs of 12" diameter and larger. For some applications, full-thickness plates of GaAs or GaP can be produced using LP-HVPE in less than a week. Also, this approach eliminates the material waste and fabrication cost of slicing and shaping thick plates from bulk crystal boules grown from the melt.

In addition, HVPE-grown GaAs windows, and especially LP-HVPE-grown GaAs windows, typically exhibit lower absorption than melt-grown "commercial off-the-shelf" (COTS) crystals, especially at wavelengths near 1 micron. In part, this is because GaAs grown using HVPE exhibits a greatly reduced concentration of impurities, because of the use of ultra-high purity gas phase precursors. More importantly, native defects are reduced because the reduced growth temperatures of LP-HVPE limit the solubility of excess arsenic that manifests itself as arsenic-on-gallium anti-sites. It is these so-called "EL2" defects that tend to cause high absorption losses in conventional, melt-grown GaAs windows at wavelengths near one micron.

Silicon wafers can be used as substrates for HVPE growth of large-scale GaAs and GaP IR window slabs. Si wafers are inexpensive, are of extremely high crystalline quality (dislocation-free), and are commercially available in very large diameters (12" standard, 18" custom, and up to 24" has been demonstrated). Si has the same diamond-like crystal structure as GaAs and GaP, and an almost identical lattice constant to GaP, allowing GaP to be grown easily on a silicon substrate.

The lattice constant for GaAs differs somewhat from silicon. However, the small difference in lattice constant between Si and GaAs can be managed through the use of thick and gradual buffer layers (made possible by the very high growth rate of HVPE), for example by varying the composition of a GaAsP seed layer from 0% to 100% arsenic, thereby beginning with a layer of GaP applied to silicon, and then gradually transitioning from GaP to GaAs.

Once the slab has been grown, the silicon substrate and any intervening buffer layers are removed from the slab. In some embodiments, these layers are simply ground and polished off of the slab. In other embodiments a sacrificial layer is included between the slab and the substrate, including any buffer layers. In some of these embodiments, after the HVPE process is complete, the sacrificial layer is chemically removed, thereby releasing the slab from the substrate (and any buffer layers 300-310). In other of these embodiments, an ion-implanted damage layer creates a defined cleavage plane that separates under applied thermal stresses to release the slab from the silicon substrate.

In some embodiments, EMI shielded GaAs and GaP windows are produced by adding a dopant such as Si to the epitaxial gases during the final stage of HVPE growth. In other embodiments, EMI shielded GaAs and GaP windows are produced by applying a layer of doped GaAs or GaP to the window in a subsequent deposition step.

Embodiments further include applying an anti-reflective coating to the window slab, or to the doped conducting layer (if present).

A first general aspect of the present disclosure is an infrared window comprising a GaP slab having a slab largest dimension that is greater than four inches, or a GaAs slab having a slab largest dimension that is greater than eight inches, said slab being formed from a substrate wafer of single crystal silicon to which at least one layer of GaAs or GaP has been applied by HVPE, the substrate wafer being subsequently removed from the slab.

In embodiments, the slab largest dimension is greater than 12 inches.

In any of the above embodiments, the slab can be substantially round, having a slab diameter of greater than four inches for GaP, or greater than eight inches for GaAs. In some of these embodiments the GaAs slab diameter is greater than 12 inches.

In any of the above embodiments, the slab can be at least 2 mm thick.

Any of the above embodiments can further include an electrically conductive layer of doped GaAs or GaP applied to the slab.

In any of the above embodiments, the substrate wafer can be a wafer of single crystal silicon.

Any of the above embodiments can further include an anti-reflective coating applied to the slab.

A second general aspect of the present disclosure is a method of producing a slab of GaAs or GaP, the slab being suitable for forming an infrared (IR) transparent window of GaAs having a window largest dimension that is greater than eight inches, or an infrared (IR) transparent window of GaP having a window largest dimension that is greater than four inches. The method includes preparing a substrate of single crystal silicon having a substrate largest dimension, placing the substrate within a reaction chamber of an HVPE reactor, applying gases to a surface of the substrate within the chamber, whereupon at least two of the gases react with each other to form a GaAs or GaP layer via HVPE, thereby growing on the substrate the slab of GaAs having a largest dimension greater than eight inches or the slab of GaP having a largest dimension greater than four inches, causing the slab to grow to a desired thickness by continuing to apply the gases to a surface of the slab, and removing the substrate from the slab of GaAs or GaP.

In embodiments, the slab largest dimension of the slab formed on the substrate is greater than 12 inches.

In any of the above embodiments, the substrate can be substantially round, having a diameter of greater than eight inches. In some of these embodiments, the substrate diameter is greater than 12 inches.

In any of the above embodiments, the desired thickness can be at least 2 mm. In some of these embodiments, a time required to grow the slab to the desired thickness is no greater than 1 week.

Any of the above embodiments can further include, during a phase of forming the slab, including a dopant gas as one of the gases that are applied to the surface of the slab, thereby forming an electrically conductive layer of doped GaAs or GaP on the slab. In some of these embodiments, the dopant gas contains silicon. In any of these embodiments, the dopant gas can be applied to the surface of the slab during a final phase of forming the slab, or during an initial phase of forming the slab.

Any of the above embodiments can further include applying a layer of doped GaAs or doped GaP to a surface of the slab after the slab has been removed from the HVPE reactor.

In any of the above embodiments, the substrate can be a wafer of single crystal silicon. In some of these embodiments, the slab is a GaAs slab, and the method further comprises forming a layer of GaP on the silicon substrate, applying layers of GaAsP onto the GaP wafer while gradually reducing a proportion of phosphorous in the gases, so that the applied layers transition from GaP to GaAs, and after the slab has been formed, grinding the silicon substrate and the layers of GaAsP off of the slab.

In any of the above embodiments, a sacrificial layer can be included between the slab and the substrate, and removing the substrate from the slab can include removing the sacrificial layer, thereby freeing the slab of GaAs or GaP from the substrate. In some of these embodiments, the sacrificial layer is chemically removed. In other of these embodiments, the sacrificial layer is an ion-implanted damage layer forming a cleavage plane, and the sacrificial layer is removed due to separating of the cleavage plane upon application thereto of thermal stress.

And any of the above embodiments can further include, after the slab has grown to the desired thickness, applying an anti-reflective coating to the slab.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3 is a cross-sectional side view illustrating a method of growing GaAs slabs by HVPE on a silicon substrate, whereby layers of GaAsP are applied to the silicon substrate having a ratio of As to P that varies gradually from 0% to 100% As;

DETAILED DESCRIPTION

The present disclosure is a method of making GaP slabs having largest dimensions greater than 4 inches and GaAs slabs having largest dimensions greater than 8 inches, and preferably up to 12 inches or more, that are sufficiently thick to be structurally competent when used as IR windows, and wherein the GaAs slabs that are produced using the disclosed method have good transparency at wavelengths near one micron.

It will be understood that the present disclosure is not limited to round GaAs and GaP slabs, and that the term "diameter" should be interpreted to mean "largest dimension" unless otherwise required by context.

More specifically, the present disclosure teaches using Hydride Vapor Phase Epitaxy (HVPE) as a method of making GaAs and GaP IR window slabs having diameters of 4 inches, 8 inches, or even 12 inches or more. In embodiments, low pressure HVPE (LP-HVPE) is used to make the slabs.

Figure 1:
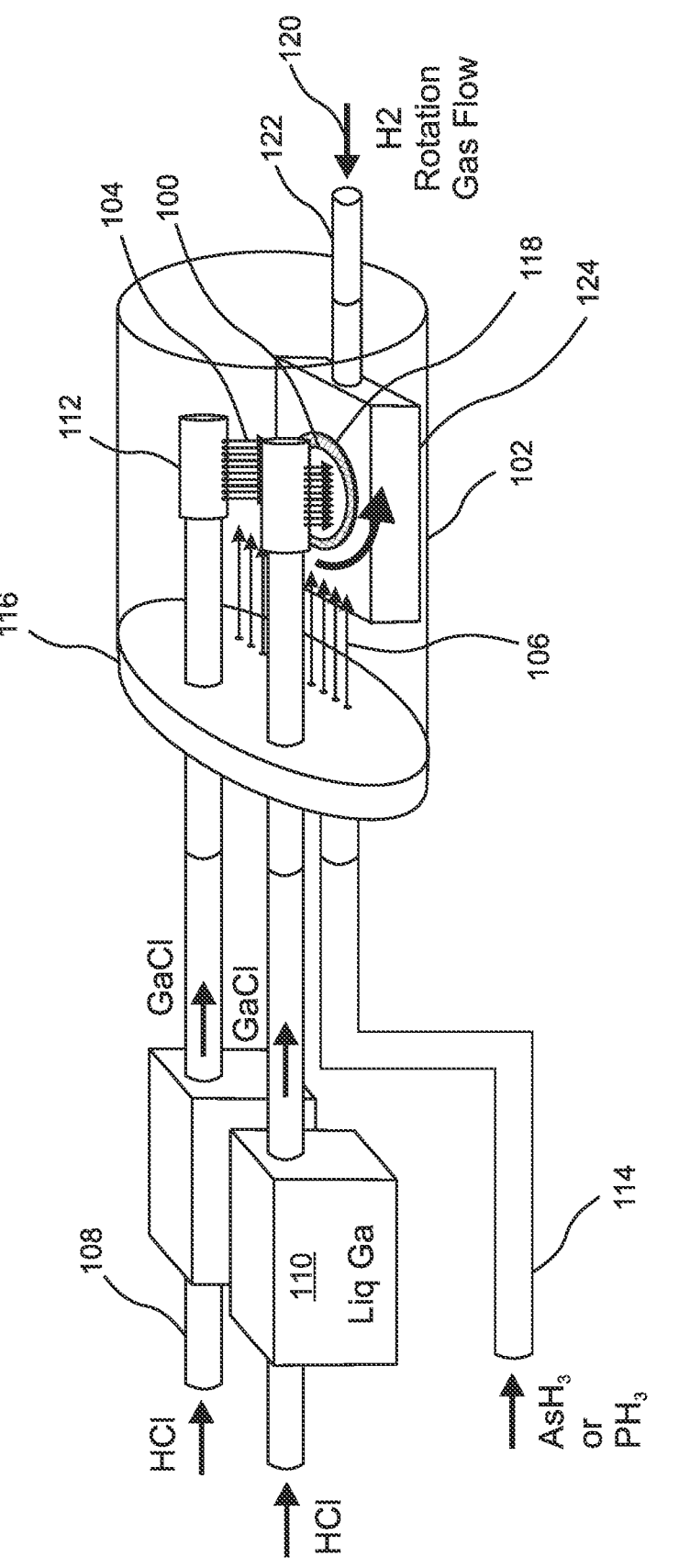
FIG. 1 is a perspective view showing a substrate wafer placed within an LP-HVPE reactor.

With reference to FIG. 1, in embodiments a substrate wafer 100 is placed within a reaction chamber 102 and subjected to two gases 104, 106 that react with each other at the surface of the substrate 100 to form GaAs or GaP, thereby growing a crystal on the substrate. In the illustrated example, HCl gas 108 flows over a reservoir of liquid gallium 110 to form GaCl gas 104 that is applied vertically to the substrate 100 by vertical nozzles 112. At the same time, $AsH_3$ gas 114 is applied horizontally to the surface of the substrate 100 by a horizontal nozzle 116. In the illustrated example, the substrate 100 rests on a substrate holder 118 that is rotated by $H_2$ gas flow 120 which flows through a support tube 122 into a susceptor 124 and across groves on the underside of the substrate holder 118, causing it to rotate during the epitaxial growth process. In similar embodiments, $PH_3$ gas 114 is applied in lieu of $AsH_3$ so as to grow a crystal of GaP on the substrate 100.

As with other epitaxial methods, HVPE has been used for growing thin layers on small wafers of GaAs and GaP for use in integrated circuits and other electronic devices, as well as for electro-optic applications such as solar cells. Unlike most epitaxial growth methods, HVPE, and especially LP-HVPE, can provide GaAs or GaP growth rates of hundreds of microns per hour, which is comparable to vertical melt growth rates, and thereby sufficient in a practical sense for producing GaAs and GaP slabs that are thick enough to be structurally competent as IR windows.

Furthermore, the thermodynamics and kinetics of the HVPE growth process (and the resulting crystal quality) are independent of diameter and layer thickness. Consequently, large-diameter substrates 100, and a reactor having a reaction chamber 102 and substrate holder 118 that are large enough to accommodate them, are fundamentally all that is required for growing GaAs and GaP window slabs of 12″ diameter and larger. For some applications, full-thickness plates of GaAs or GaP can be produced using LP-HVPE in less than a week. Also, this approach eliminates the material waste and fabrication cost of slicing and shaping thick plates from bulk crystal boules grown from the melt.

Figure 2:
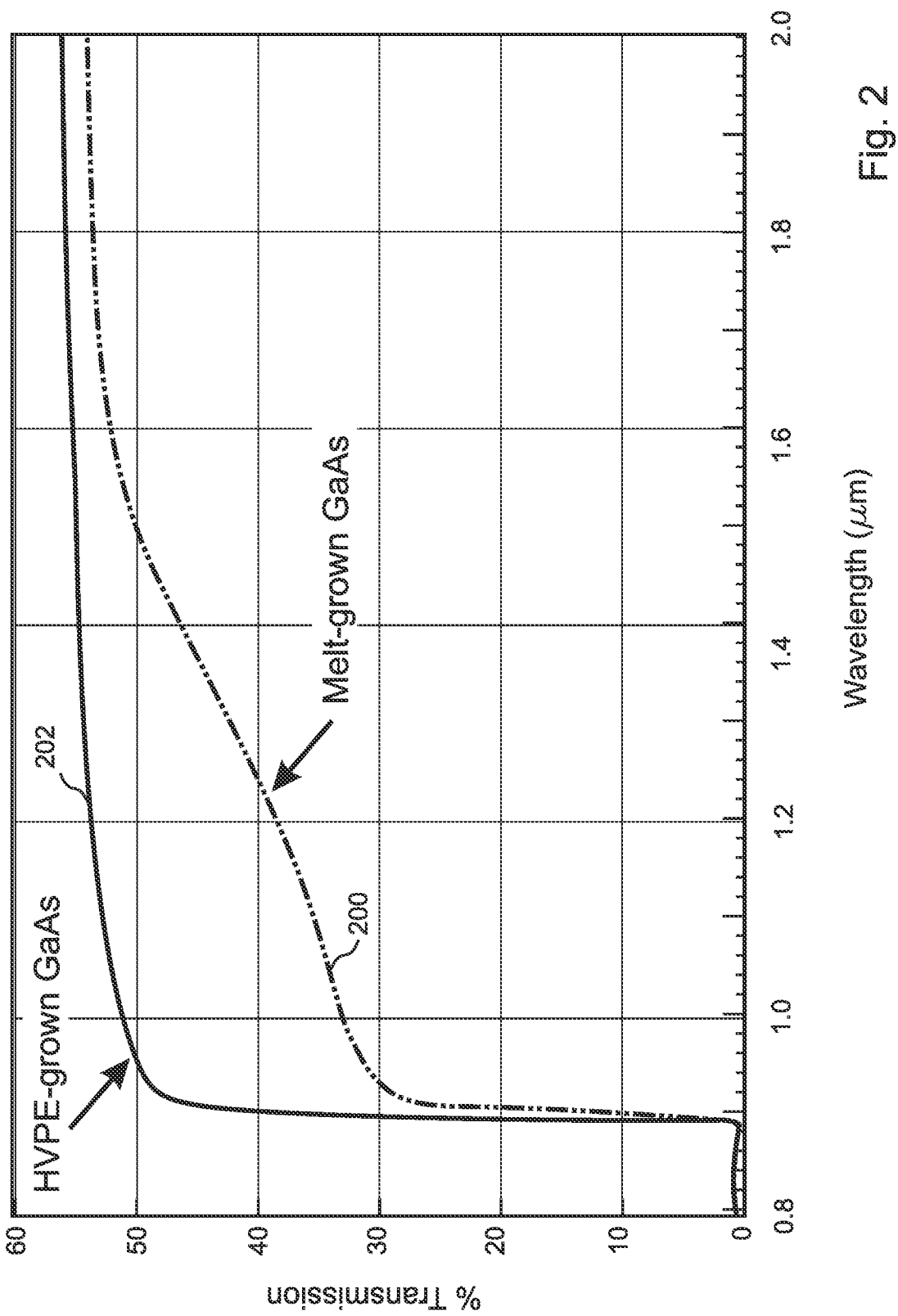
FIG. 2 is a graph that illustrates the decreased absorption near 1 micron of GaAs grown via LP-HVPE as compared to GaAs from a boule grown from melt.

With reference to FIG. 2, it is notable that HVPE-grown GaAs windows, and especially LP-HVPE-grown GaAs windows 202, typically exhibit significantly lower absorption than melt-grown "commercial off-the-shelf" (COTS) GaAs crystals 200, especially at wavelengths near 1 micron. In part, this is because GaAs grown using HVPE exhibits a greatly reduced concentration of impurities due to the use of ultra-high purity gas phase precursors. More importantly, native defects are reduced because the reduced growth temperatures of HVPE limit the solubility of excess arsenic that manifests itself as arsenic-on-gallium anti-sites. It is these so-called "EL2" defects that tend to cause high absorption losses in conventional, melt-grown GaAs windows at wavelengths near one micron. In the illustrated example, a GaAs wafer approximately 1 mm thick grown vertically from melt and sliced from a boule transmits less than 35% at one micron, whereas a GaAs layer of similar doping and thickness grown by LP-HVPE transmits more than 50% at the same wavelength.

Silicon wafers can be used as substrates 100 for HVPE growth of large GaAs and GaP IR window slabs. Si wafers are inexpensive, are of extremely high crystalline quality (dislocation-free), and are commercially available in very large diameters (12″ standard, 18″ custom, and up to 24″ has been demonstrated). Si has the same diamond-like crystal structure and an almost identical lattice constant to GaP, allowing GaP slabs to be grown easily on a silicon substrate.

Figure 3:
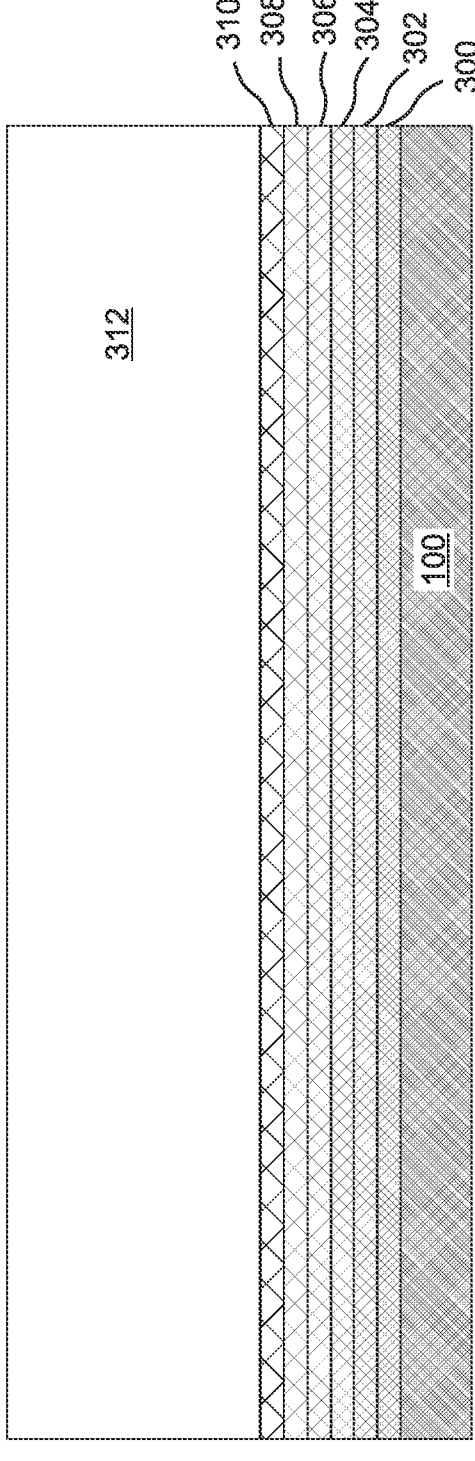

The lattice constant for GaAs differs somewhat from silicon. However, the small difference in lattice constant between Si and GaAs can be managed through the use of thick and gradual buffer layers (made possible by the very high growth rate of HVPE). With reference to FIG. 3, for example, the ratio of As to P of a GaAsP seed layer can be varied from 0% to 100% arsenic, thereby beginning with a layer of GaP 300 applied to a silicon substrate 100, and then applying a series of layers of GaAsP 302, 304, 30\6, 308, 310 that gradually transition from GaP 302 to GaAs 312.

Figure 4A:
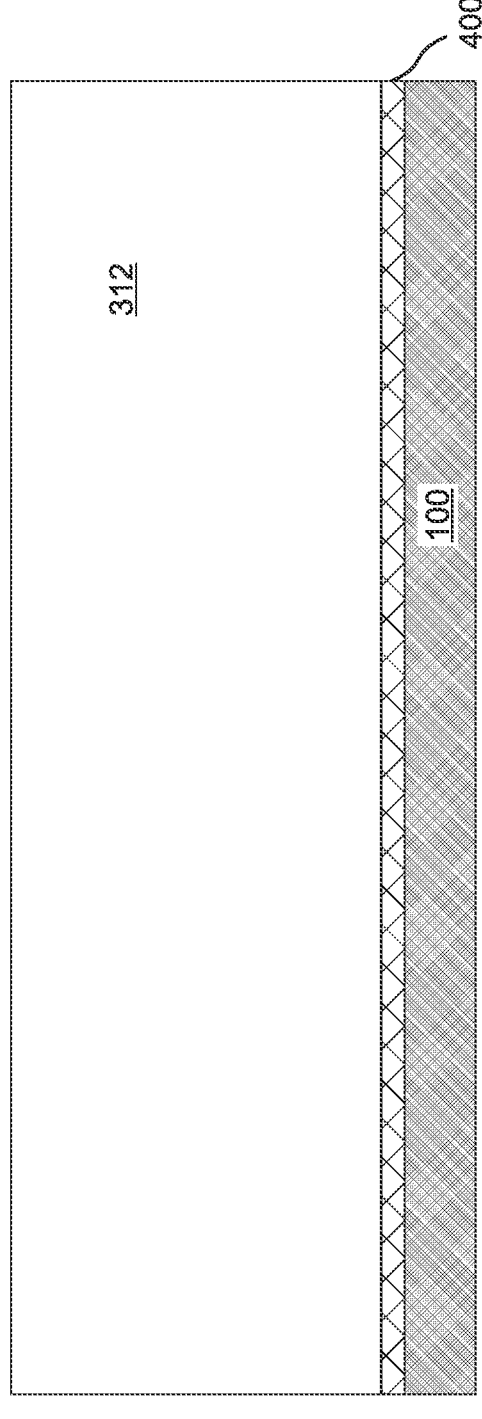
FIG. 4A is a cross-sectional side view illustrating an embodiment where a sacrificial layer is included between the GaAs or GaP slab and the silicon substrate.
Figure 4B:
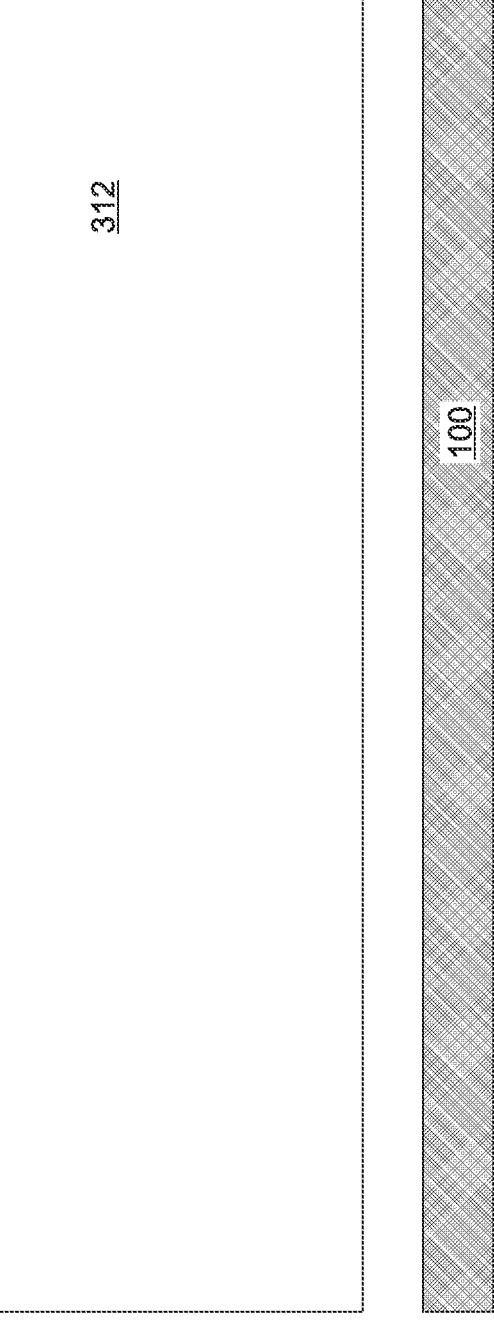
FIG. 4B is a cross-sectional side view illustrating the embodiment of FIG. 4A after the sacrificial layer has been removed, freeing the GaAs or GaP slab from the substrate.

Once the slab 312 has been grown, the Si substrate, and any intervening buffer layers 300-310 are removed from the slab 312. In some embodiments, these layers are simply ground and polished off of the slab 312. In other embodiments, with reference to FIG. 4A, a sacrificial layer 400 is included between the slab 312 and the substrate 100 with any buffer layers 300-310. In some of these embodiments, after the HVPE process is complete, the sacrificial layer 400 is chemically removed, thereby releasing the slab 312 from the substrate 100 (and any buffer layers 300-310), as is illustrated in FIG. 4B. In other of these embodiments, an ion-implanted damage layer 400 creates a defined cleavage plane that separates under applied thermal stresses to release the slab 312 from the silicon substrate 100.

In some embodiments, EMI shielded GaAs and GaP windows are produced by adding a dopant such as Si to the epitaxial gasses during the final stage of HVPE growth. In other embodiments, EMI shielded GaAs and GaP windows are produced by applying a layer of doped GaAs or GaP to the window in a subsequent deposition step.

Embodiments further include applying an anti-reflective coating to the window slab or to the doped conducting layer (if present).

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. An infrared window comprising a GaAs slab having a slab largest dimension that is greater than eight inches, said slab being formed from a substrate wafer of single crystal silicon to which at least one layer of GaAs has been applied by Hydride Vapor Phase Epitaxy ("HVPE"), the substrate wafer being removable from the slab.

2. The infrared window of claim 1, wherein the slab largest dimension is greater than 12 inches.

3. The infrared window of claim 1, wherein the slab is substantially round, having a slab diameter of greater than eight inches.

4. The infrared window of claim 3, wherein the slab diameter is greater than 12 inches.

5. The infrared window of claim 1, wherein the slab is at least 2 mm thick.

6. The infrared window of claim 1, further comprising an electrically conductive layer of doped GaAs or GaP applied to the slab.

7. The infrared windows of claim 1, wherein the substrate wafer is a wafer of single crystal silicon.

8. The infrared window of claim 1, further comprising an anti-reflective coating applied to the slab.

* * * * *